(12) United States Patent
Shimosawa et al.

(10) Patent No.: US 11,022,653 B2
(45) Date of Patent: Jun. 1, 2021

(54) DETERIORATION DEGREE ESTIMATION DEVICE AND DETERIORATION DEGREE ESTIMATION METHOD

(71) Applicant: Nissan Motor Co., Ltd., Yokohama (JP)

(72) Inventors: Hironobu Shimosawa, Kanagawa (JP); Kenichi Sakai, Kanagawa (JP); Kenji Hosaka, Kanagawa (JP); Tomoyuki Shiratsuchi, Kanagawa (JP)

(73) Assignee: Nissan Motor Co., Ltd., Yokohama (JP)

( * ) Notice: Subject to any disclaimer, the term of this patent is extended or adjusted under 35 U.S.C. 154(b) by 0 days.

(21) Appl. No.: 15/754,607

(22) PCT Filed: Aug. 26, 2015

(86) PCT No.: PCT/JP2015/074021
§ 371 (c)(1),
(2) Date: Feb. 23, 2018

(87) PCT Pub. No.: WO2017/033311
PCT Pub. Date: Mar. 2, 2017

(65) Prior Publication Data
US 2018/0246174 A1 Aug. 30, 2018

(51) Int. Cl.
*G01R 31/392* (2019.01)
*G01R 31/389* (2019.01)
(Continued)

(52) U.S. Cl.
CPC ......... *G01R 31/392* (2019.01); *G01R 31/389* (2019.01); *H01M 10/0525* (2013.01); *H01M 10/48* (2013.01); *H02J 7/00* (2013.01)

(58) Field of Classification Search
CPC .......... G01R 31/3679; G01R 31/3662; H01M 10/0525
(Continued)

(56) References Cited

U.S. PATENT DOCUMENTS 7,211,987 B2    5/2007   Aoki et al.
7,423,408 B2 *  9/2008   Koch ................... G01R 31/367
                                                          320/132
(Continued)

FOREIGN PATENT DOCUMENTS

CN         1616981 A      5/2005
CN       100412564 C      8/2008
(Continued)

*Primary Examiner* — Jack K Wang
(74) *Attorney, Agent, or Firm* — Global IP Counselors, LLP

(57) ABSTRACT

A deterioration degree estimation device includes an internal resistance detection unit, a deterioration management unit and a deterioration degree estimation unit. The internal resistance detection unit detects an internal resistance of a battery. The deterioration management unit manages a cycle deterioration of the battery. The deterioration degree estimation unit estimates a deterioration degree of the battery as an estimated deterioration degree based on an increase rate of the internal resistance. The deterioration degree estimation unit estimates the estimated deterioration degree such that the estimated deterioration degree decreases as the cycle deterioration increases, or such that the estimated deterioration degree increases as the cycle deterioration degree decreases.

6 Claims, 7 Drawing Sheets

(51) Int. Cl.
*H02J 7/00* (2006.01)
*H01M 10/48* (2006.01)
*H01M 10/0525* (2010.01)

(58) Field of Classification Search
USPC .................................................. 340/636.19
See application file for complete search history.

(56) References Cited

U.S. PATENT DOCUMENTS

| | | | |
|---|---|---|---|
| 7,425,814 | B2 | 9/2008 | Tsuchiya et al. |
| 7,714,736 | B2* | 5/2010 | Gielniak ............. G01R 31/392 340/636.1 |
| 2003/0057918 | A1 | 3/2003 | Aoki et al. |
| 2009/0237087 | A1* | 9/2009 | Anbari ................ G01R 31/392 324/433 |
| 2012/0072144 | A1* | 3/2012 | Zhang ................ G01R 31/3828 702/63 |
| 2012/0310571 | A1* | 12/2012 | Takagi ................ G01R 31/392 702/65 |
| 2013/0300425 | A1* | 11/2013 | Shiraishi ........... G01R 31/3835 324/426 |
| 2013/0307334 | A1* | 11/2013 | Middleton ......... G01R 31/3842 307/31 |
| 2013/0314050 | A1* | 11/2013 | Matsubara ................ H02J 7/00 320/134 |
| 2014/0159736 | A1* | 6/2014 | Morimoto ............... B60L 58/16 324/426 |
| 2014/0225571 | A1* | 8/2014 | Obata .................... H02J 7/007 320/136 |
| 2014/0225621 | A1* | 8/2014 | Kimura ............. G01R 31/3842 324/426 |
| 2014/0368208 | A1* | 12/2014 | Yamada ............. G01R 31/3842 324/433 |
| 2015/0212161 | A1* | 7/2015 | Soga .................... G01R 31/367 702/63 |
| 2015/0236525 | A1* | 8/2015 | Aridome ........... H02J 7/007194 320/107 |
| 2015/0241516 | A1* | 8/2015 | Hotta ................. G01R 31/3835 429/90 |
| 2015/0293183 | A1* | 10/2015 | Tenmyo ............... G01R 31/367 324/429 |
| 2016/0001766 | A1* | 1/2016 | Mori ....................... B60L 58/13 701/22 |
| 2016/0011275 | A1* | 1/2016 | Saito ................... G01R 31/389 324/430 |
| 2016/0187432 | A1* | 6/2016 | Saint-Marcoux .... G01R 31/392 702/63 |
| 2016/0236581 | A1* | 8/2016 | Tashiro .................. B60L 58/14 |
| 2017/0047622 | A1* | 2/2017 | Tashiro ................ H01M 10/48 |
| 2017/0141589 | A1* | 5/2017 | Inoue ..................... H02J 7/0014 |
| 2017/0145977 | A1* | 5/2017 | Toyama ................. B60L 15/20 |

FOREIGN PATENT DOCUMENTS

| | | |
|---|---|---|
| CN | 104115017 A | 10/2014 |
| EP | 1 531 335 A2 | 5/2005 |
| JP | 2008-228492 A | 9/2008 |
| JP | 2009-193919 A | 8/2009 |
| JP | 2012-185122 A | 9/2012 |
| JP | 2014-105995 A | 6/2014 |
| JP | 2015-26478 A | 2/2015 |
| JP | 2015-81823 A | 4/2015 |
| WO | 2014/080764 A1 | 5/2014 |

* cited by examiner

DETERIORATION DEGREE ESTIMATION DEVICE AND DETERIORATION DEGREE ESTIMATION METHOD

CROSS-REFERENCE TO RELATED APPLICATIONS

This application is a U.S. National stage application of International Application No. PCT/JP2015/074021, filed Aug. 26, 2015.

BACKGROUND

Field of the Invention

The present invention relates to a deterioration degree estimation device and a deterioration degree estimation method for estimating the deterioration degree of a battery.

Background Information

As a method of determining the deterioration degree of a lithium ion secondary battery, a method of detecting the deterioration degree of a battery from the internal resistance of the secondary battery is known. As a property of a battery, since the internal resistance of a battery is increased when the battery deteriorates, the deterioration degree of the battery can be detected from the internal resistance. First, the voltage and the current that flows in the battery are detected, and the internal resistance of the battery is calculated from a predetermined formula. A table for specifying the deterioration degree from the internal resistance is stored. Then, the deterioration degree is calculated using the stored table (Japanese Laid Open Patent Application No. 2008-228492- referred to as Patent Document 1).

SUMMARY

However, since, in the deterioration degree determination method described above, the deterioration degree of the battery is determined using only the internal resistance of the battery, there is the problem that the estimation accuracy of the deterioration degree is low.

The problem to be solved by the present invention is to provide a deterioration degree estimation device or a deterioration degree estimation method with a high estimation accuracy.

The present invention solves the problem described above by managing the battery cycle deterioration, estimating an estimated deterioration degree of the battery based on the increase rate of the internal resistance of the battery, such that the estimated deterioration degree decreases as the cycle deterioration increases, or such that the estimated deterioration degree increases as the cycle deterioration degree decreases.

According to the present invention, when the internal resistance of the battery increases, a value corresponding to how the battery is used is reflected in the calculation of the deterioration degree; therefore, the estimation accuracy of the deterioration degree is increased.

DETAILED DESCRIPTION OF THE EMBODIMENTS

Embodiments of the present invention will be explained below based on the drawings.

First Embodiment 1

Figure 1:
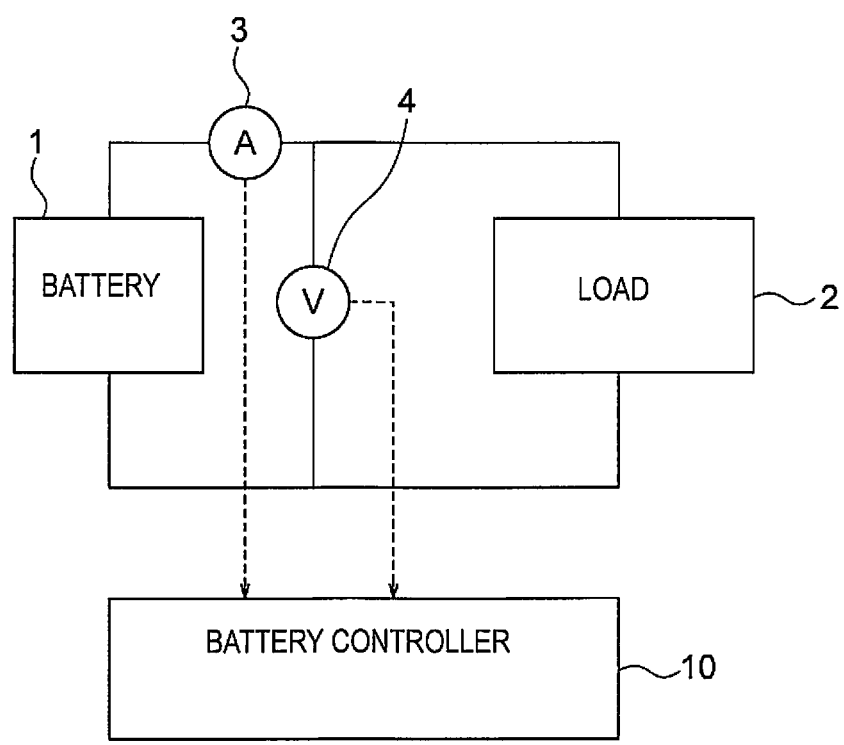
FIG. 1 is a block view of a deterioration degree estimation device according to an embodiment of the present invention.

FIG. 1 is a block view of a deterioration degree estimation device according to an embodiment of the present invention. The deterioration degree estimation device is provided in a vehicle, and the like, that has a battery. The deterioration degree estimation device is not limited to a vehicle, and can be provided in another device equipped with a battery.

The deterioration degree estimation device comprises a battery 1, a load 2, a current sensor 3, a voltage sensor 4, and a battery controller 10. The battery 1 is configured from a plurality of secondary batteries that are connected in series or in parallel. The secondary battery is a lithium ion battery, a nickel hydrogen battery, or the like. The battery 1 is connected to a charger, which is not shown.

The load 2 is connected to the battery 1 by wiring. The load 2 is driven by the electric power of the battery 1. The load 2 is a motor, or the like. The current sensor 3 and the voltage sensor 4 detect the state of the battery, and are electrically connected to the battery 1. The current sensor 3 detects the current of the battery 1. The voltage sensor 4 detects the voltage of the battery 1. The detection values of the current sensor 3 and the voltage sensor 4 are output to the battery controller 10. The battery controller 10 is a control device for managing the state of the battery 1.

Figure 2:
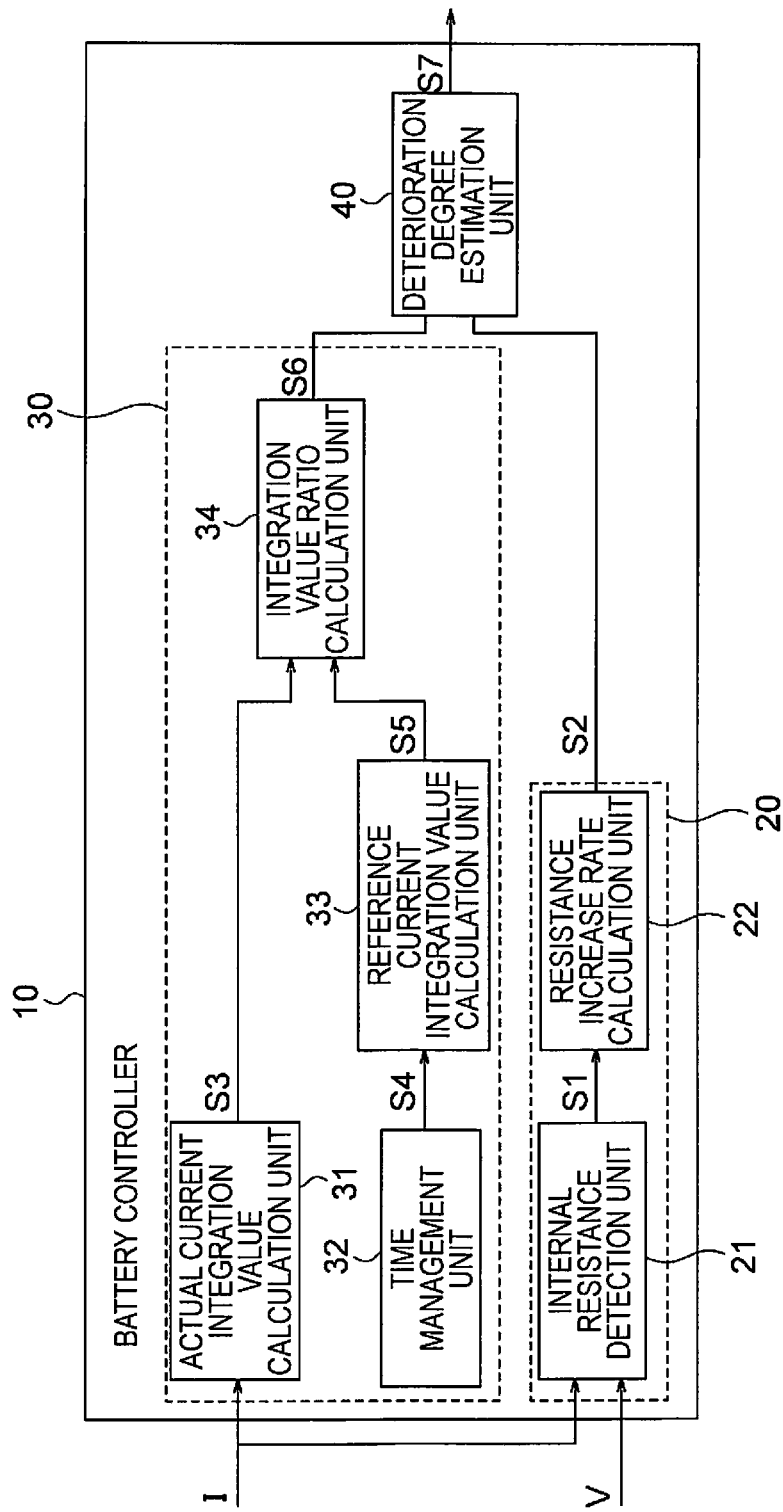
FIG. 2 is a block view of a battery controller of FIG. 1.

Next, the configuration of the battery controller 10 will be described using FIG. 2. FIG. 2 is a block view of the battery controller 10. The battery controller 10 is configured from a CPU, a ROM, and the like. The battery controller 10 comprises a controller illustrated in FIG. 2 as a function block for estimating the deterioration degree of the battery 1. The battery controller 10 comprises an internal resistance management unit 20, a deterioration management unit 30, and a deterioration degree estimation unit 40.

The internal resistance management unit 20 manages the internal resistance of the battery 1 on the basis of the detected current of the current sensor 3 and the detected voltage of the voltage sensor 4. The internal resistance management unit 20 comprises an internal resistance detection unit 21 and a resistance increase rate calculation unit 22.

The internal resistance detection unit 21 detects (calculates) the internal resistance of the battery 1 on the basis of the detected value of the current sensor 3 and the detected value of the voltage sensor 4. The resistance increase rate calculation unit 22 calculates the increase rate of the internal resistance.

The deterioration management unit 30 manages the cycle deterioration of the battery 1. In the present embodiment, the deterioration management unit 30 manages the cycle deterioration degree by calculating the current integration value of the battery 1. The deterioration management unit 30 comprises an actual current integration value calculation unit 31, a time management unit 32, a reference current integration value calculation unit 33, and an integration value ratio calculation unit 34.

The actual current integration value calculation unit 31 calculates the current integration value of the battery 1 by integrating the detected current of the current sensor 3. The time management unit 32 manages the elapsed time from the start of use of the battery 1. The reference current integration value calculation unit 33 calculates a reference current integration value on the basis of the elapsed time that is managed by the time management unit 32. The current integration value that is calculated by the actual current integration value calculation unit 31 is the integrated value of the actual discharge current. On the other hand, the reference current integration value that is calculated by the reference current integration value calculation unit 33 is a current integration value corresponding to the elapsed time, and is not an integrated value of the actual discharge current.

The integration value ratio calculation unit 34 calculates the ratio of the current integration value. The ratio is the actual current integration value relative to the reference current integration value.

The deterioration degree estimation unit 40 calculates the deterioration degree of the battery 1 on the basis of the internal resistance of the battery 1. In addition, the deterioration degree estimation unit 40 corrects the deterioration degree corresponding to the internal resistance, in accordance with the magnitude of the current integration value ratio that is calculated by the integration value ratio calculation unit 34. The deterioration degree estimation unit 40 thereby estimates the corrected deterioration degree as the final deterioration degree of the battery 1.

Figure 3:
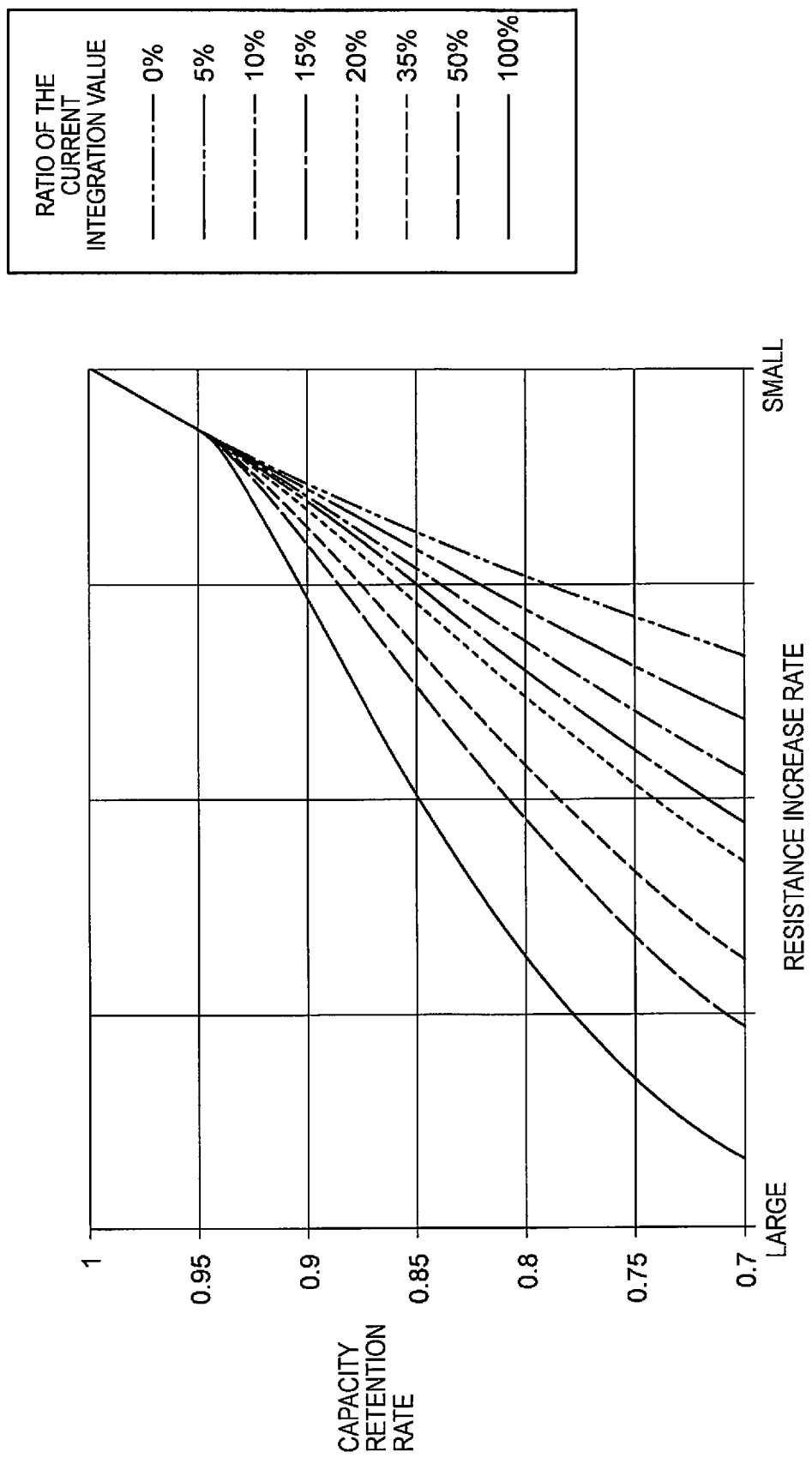
FIG. 3 is a graph illustrating the characteristics of the resistance increase rate, the ratio of the current integration value, and the capacity retention rate.

Next, the method of estimating the deterioration degree of the battery 1 will be described with reference to FIG. 2 and FIG. 3. FIG. 3 is a graph illustrating the correspondence between the resistance increase rate, the ratio of the current integration value, and the capacity retention rate. Steps S1-S7 of the block view of FIG. 2 illustrate the control flow of the deterioration degree estimation method.

The internal resistance detection unit 21 uses a current sensor 3 and a voltage sensor 4 to acquire the detected current and the detected voltage, plots the acquired detected current and detected voltage on a graph having the current value and the voltage value as axes, and, at the same time, calculates the IV characteristic, which is a straight line approximating the plotted current value and voltage value, and calculates the internal resistance from the inclination of the IV characteristic (Step S1). The method of calculating the internal resistance is not limited to the method of calculating from the inclination oxide film layer the IV characteristic, and can be another method. For example, the internal resistance can be calculated by substituting the current value detected by the current sensor 3 and the voltage value detected by the voltage sensor 4 into a battery model formula, which is stored in advance and which includes the current value, voltage value, and internal resistance in the parameter. Since these internal resistance calculation methods are well-known, the details are not described herein.

The resistance increase rate calculation unit 22 calculates the resistance increase rate by calculating the ratio of the initial value of the internal resistance (the internal resistance value corresponding to the internal resistance value when the battery 1 is new, and which is stored in advance), and the internal resistance calculated by the internal resistance detection unit 21 (Step S2). The increase rate of the internal resistance corresponds to the ratio of the calculated value of the internal resistance relative to the initial value of the internal resistance. That is, the resistance increase rate means the increase rate relative to the initial value of the internal resistance. The initial value of the internal resistance can be a value stored in advance in the resistance increase rate calculation unit 22. Alternatively, the initial value can be a value calculated by the internal resistance detection unit 21 at the time of start of use of the battery 1. The resistance increase rate calculation unit 22 outputs the calculated resistance increase rate to the deterioration degree estimation unit 40.

The actual current integration value calculation unit 31 calculates the actual current integration value of the battery 1 by integrating the detected current of the current sensor 3 (Step S3). The current integration value is the integrated value of the discharge current of the battery 1. In addition, the current integration value is the current integration value from the start of use of the battery 1 to the present. The time management unit 32 manages the elapsed time of the battery 1, in accordance with the calculation timing of the current integration value by the actual current integration value calculation unit 31 (Step S4).

The reference current integration value calculation unit 33 calculates the current integration value corresponding to the elapsed time as the reference current integration value (Step S5). The reference current integration value is a value in which the current integration value at the elapsed time is set in advance. The reference current integration value is a value that is set in advance as an evaluation value that evaluates the integrated value of the discharge current under a PR environment. The reference current integration value becomes larger as the elapsed time increases. For example, if 1 C charging and 1 C discharging are repeated for a predetermined number of times during a predetermined period, the integrated value of the discharge time during the predetermined period becomes the reference current integration value corresponding to said predetermined period. The correspondence relationship between the elapsed time and the reference current integration value is stored in the reference current integration value calculation unit 33 in advance as a map, or the like.

The integration value ratio calculation unit 34 calculates the ratio of the current integration value (Step S6). The ratio of the current integration value is the ratio of the actual current integration value at a predetermined elapsed time and the reference current integration value corresponding to said elapsed time. If the ratio of the current integration value is high, the actual current integration value becomes large; therefore, the cycle deterioration becomes larger than the storage deterioration. On the other hand, if the ratio of the current integration value is low, the actual current integration value becomes small relative to the current integration value that was evaluated beforehand (corresponding to the reference current integration value); therefore, the cycle deterioration becomes smaller than the storage deterioration. That is, the ratio of the current integration value represents the rate of the influence of cycle deterioration at the elapsed time. Here, in general, storage deterioration is deterioration that occurs over time regardless of the charging and discharging of the battery, and cycle deterioration means deterioration that occurs due to the charging and discharging of the battery.

Meanwhile, as a characteristic of the battery 1, the internal resistance increases as the deterioration of the battery 1 progresses. Accordingly, it is possible to calculate the deterioration degree of the battery 1 from the increase rate of the internal resistance. The deterioration degree of the battery 1 is represented by the storage deterioration and the cycle deterioration. That is, the deterioration of the battery 1 includes storage deterioration and cycle deterioration. From the point of view of influence on the deterioration degree, even if the deterioration degree of the battery 1 is the same value (the increase rate of the internal resistance is the same), the rate at which the storage deterioration influences the deterioration degree and the rate at which the cycle deterioration influences the deterioration degree are different depending on how the battery is used.

Here, it is assumed that a predetermined period has elapsed since the start of use of the battery 1, and that the increase rate of the internal resistance has reached a predetermined value. If the cycle deterioration has a greater influence on the deterioration degree of the battery 1 than the storage deterioration when the increase rate of the internal resistance reaches the predetermined value, the deterioration speed of the battery 1 is high, and the elapsed time from the start of use becomes short. On the other hand, if the storage deterioration has a greater influence on the deterioration degree of the battery 1 than the cycle deterioration when the increase rate of the internal resistance reaches the predetermined value, the deterioration speed of the battery 1 is low, and the elapsed time from the start of use becomes long. The deterioration degree of the battery 1 is larger when the increase rate of the internal resistance reaches the predetermined value over a long time. That is, if the increase rate of the internal resistance is the same, the deterioration degree of the battery 1 decreases as the cycle deterioration increases, and the deterioration degree of the battery 1 increases as the storage deterioration increases. The deterioration degree estimation unit 40 estimates the deterioration degree of the battery 1 using this characteristic.

The deterioration degree estimation unit 40 stores the correspondence relationship between the resistance increase rate, the ratio of the current integration value, and the capacity retention rate as a map. According to the correspondence relationship represented by the map, the capacity retention rate decreases as the resistance increase rate increases, as illustrated in FIG. 3. In addition, when the resistance increase rate is set to a constant value, the capacity retention rate decreases as the ratio of the current integration value decreases. In other words, it can be said that if the deterioration degree of the battery is constant, the capacity retention rate decreases as the ratio of the cycle deterioration decreases, that is, as the ratio of the storage deterioration increases. Furthermore, it can also be said that if the deterioration degree of the battery is constant, the capacity retention rate increases as the ratio of the cycle deterioration increases, that is, as the ratio of the storage deterioration decreases. The capacity retention rate is in an inverse relationship with the deterioration degree of the battery 1, and the deterioration degree decreases as the capacity retention rate increases. The deterioration degree estimation unit 40 refers to a map, and estimates the capacity retention rate corresponding to the resistance increase rate and the ratio of the current integration value as the current capacity retention rate of the battery 1 (Step S7). When the resistance increase rate is the same value, the deterioration degree estimation unit 40 estimates the current deterioration degree of the battery 1 such that the deterioration degree of the battery 1 decreases as the ratio of the current integration value increases. As a result, the deterioration degree estimation unit 40 corrects the resistance deterioration degree calculated based on the internal resistance of the battery 1 such that the resistance deterioration degree decreases as the cycle deterioration increases, and estimates the corrected resistance deterioration degree as the current deterioration.

As described above, in the present embodiment, the internal resistance of the battery 1 is calculated, the cycle deterioration of the battery 1 is managed, and the deterioration degree of the battery 1 is estimated based on the increase rate of the internal resistance of the battery 1. Then, the estimated deterioration degree of the battery 1 is decreased as the cycle deterioration is increased. It is thereby possible to increase the estimation accuracy of the deterioration degree of the battery 1.

In addition, in the present embodiment, the cycle deterioration is managed by calculating the current integration value of the battery 1. It is thereby possible to easily grasp how the battery 1 is used.

In addition, in the present embodiment, a map representing the correspondence relationship between the increase rate of the internal resistance, the current integration value, and the deterioration degree is stored in advance, and the deterioration degree is estimated with reference to the map. Since it is thereby possible to grasp the transition of the deterioration degree according to how the battery is used in accordance with the battery characteristics, it is possible to increase the estimation accuracy of the deterioration degree of the battery 1.

As a modified example of the present embodiment, the deterioration degree estimation unit 40 can calculate a deterioration degree corresponding to the increase rate of the internal resistance, correct the calculated deterioration degree based on the current integration value, and estimate the corrected deterioration degree as the deterioration degree of the battery 1. A map representing the correspondence relationship between the increase rate of the internal resistance and the deterioration degree is stored in advance in the deterioration degree estimation unit 40. A correction coefficient for correcting the deterioration degree is set in advance in the deterioration degree estimation unit 40. The correction coefficient changes according to the current integration value. The maximum value of the correction coefficient is set to 1.0, and the correction coefficient decreases as the ratio of the current integration value decreases. Then, the deterioration degree estimation unit 40 estimates the final deterioration degree by multiplying the deterioration degree calculated from the map by the correction coefficient. As a result, when the internal resistance of the battery 1 reaches a certain internal resistance, the estimated deterioration degree decreases as the cycle deterioration increases. The setting value of the correction coefficient can be a value other than 1.0, and the calculation method for correcting the deterioration degree can be another method.

In addition, as a modified example of the present embodiment, the deterioration degree estimation unit 40 can correct the increase rate of the internal resistance based on the current integration value. A map representing the correspondence relationship between the increase rate of the internal resistance and the deterioration degree is stored in advance in the deterioration degree estimation unit 40. In addition, a correction coefficient for correcting the increase rate of the internal resistance is set in advance in the deterioration degree estimation unit 40. The correction coefficient changes according to the current integration value. The maximum value of the correction coefficient is set to 1.0, and the correction coefficient increases as the ratio of the current integration value decreases. The deterioration degree estimation unit 40 calculates the corrected internal resistance increase rate by multiplying the increase rate of the internal resistance by the correction coefficient. The corrected internal resistance increase rate increases as the ratio of the current integration value decreases. Then, the deterioration degree estimation unit 40 refers to the map, and estimates the deterioration degree corresponding to the corrected internal resistance increase rate as the final deterioration degree.

In addition, as a modified example of the present embodiment, the deterioration degree estimation unit 40 can correct the deterioration degree based on the temperature of the battery 1. The deterioration degree of the battery 1 has a dependency with respect to the temperature, and the degree of progress of deterioration differs depending on the temperature of the battery 1. The battery 1 has a characteristic of being easily deteriorated at a certain temperature and not being easily deteriorated at other temperatures. The deterioration degree estimation unit 40 stores a correction coefficient that represents the relationship between deterioration and temperature, and carries out a correction based on the temperature by multiplying the estimated deterioration degree by the correction coefficient. As a result, it is possible to increase the estimation accuracy of the deterioration degree. In addition to a method of multiplying a correction coefficient, the method of correcting the deterioration degree can be a calculation method that uses a map. The temperature of the battery 1 can be detected by a sensor provided to the battery 1.

In addition, as a modified example of the present embodiment, the deterioration degree estimation unit 40 can correct the deterioration degree based on the charging state of the battery 1 (SOC: State of Charge). The deterioration degree of the battery 1 has a dependency with respect to the SOC, and the degree of progress of deterioration differs depending on the SOC of the battery 1 (the SOC when the battery 1 is stored, the SOC when the battery 1 is used). The battery 1 has a characteristic of being easily deteriorated at a certain SOC and not being easily deteriorated at other SOCs. The deterioration degree estimation unit 40 stores a correction coefficient that represents the relationship between SOC and temperature//I think this should be "relationship between SOC and deterioration degree"//, and carries out a correction based on the SOC by multiplying the estimated deterioration degree by the correction coefficient. As a result, it is possible to increase the estimation accuracy of the deterioration degree. In addition to a method of multiplying a correction coefficient, the method of correcting the deterioration degree can be a calculation method that uses a map. The SOC of the battery 1 can be obtained by calculation using the detection value of the current sensor 3 or the detection value of the voltage sensor 4.

Second Embodiment

Figure 4:
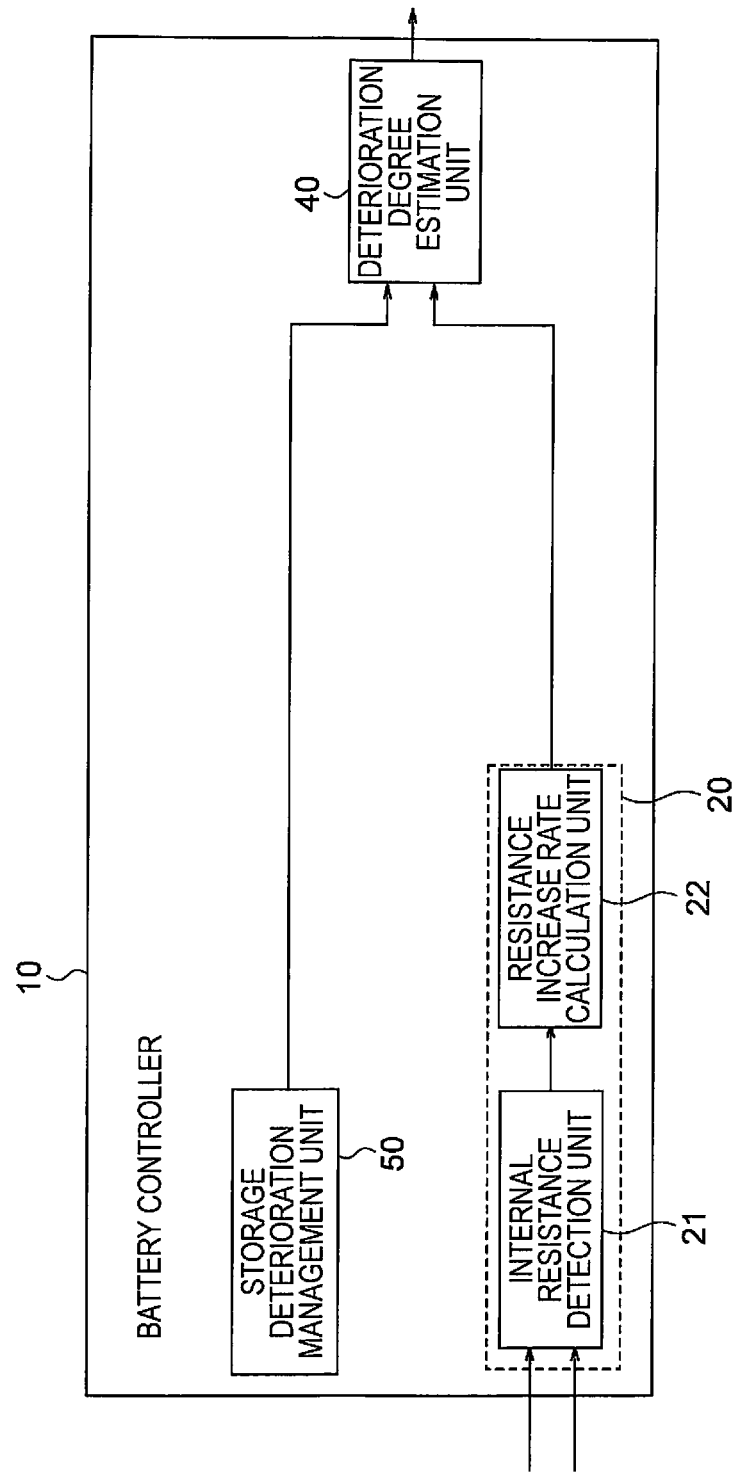
FIG. 4 is a block view of the battery controller in a deterioration degree estimation device according to another embodiment of the present invention.

A deterioration degree estimation device according to another embodiment of the present invention will be described using FIG. 4. The present embodiment is different from the first embodiment described above in the point that the storage deterioration of the battery 1 is managed, and the deterioration degree of the battery 1 is estimated in accordance with the magnitude of the storage deterioration. The other configurations are the same as the above-described first embodiment, and the descriptions thereof are incorporated by reference. FIG. 4 is a block view of the battery controller 10.

The battery controller 10 comprises an internal resistance management unit 20, a deterioration degree estimation unit 40, and a storage deterioration management unit 50. The configuration of the internal resistance management unit 20 is the same as the configuration of the internal resistance management unit 20 according to the first embodiment.

The storage deterioration management unit 50 manages the storage deterioration of the battery 1. In the present embodiment, the storage deterioration management unit 50 manages the storage deterioration of the battery 1 by measuring the elapsed time of the battery 1 using a timer. Storage deterioration is deterioration that progresses over time due to a chemical reaction between the electrolyte and the electrode of a battery. The storage deterioration management unit 50 measures the elapsed time since the electrode comes in contact with the electrolyte, and obtains the current storage deterioration based on the elapsed time.

The storage deterioration managed by the storage deterioration management unit 50 is set as the storage deterioration from when the electrode comes in contact with the electrolyte to the present time. The storage deterioration management unit 50 measures the time from when the electrode comes in contact with the electrolyte to the present time as the elapsed time, and calculates the storage deterioration based on the elapsed time.

Figure 5:
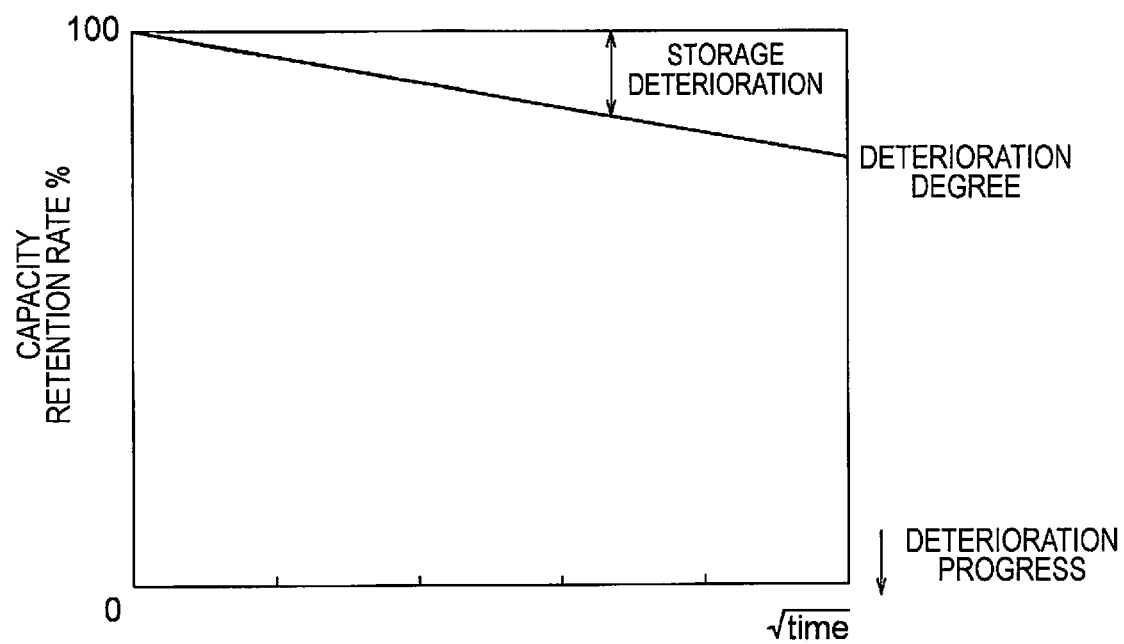
FIG. 5 is a graph illustrating the time characteristic of the capacity retention rate and the deterioration degree.

The characteristic of the storage deterioration is illustrated in FIG. 5. FIG. 5 is a graph illustrating the time characteristic of the storage deterioration. In FIG. 5, the horizontal axis represents the square root of time, and the vertical axis represents the deterioration degree of the storage deterioration and the capacity retention rate. The characteristic illustrated in FIG. 5 can be acquired using a common storage test for battery evaluation.

Storage deterioration progresses in proportion to the square root of time, as illustrated in FIG. 5. A map representing the relationship between elapsed time and storage deterioration is stored in the storage deterioration management unit 50. The storage deterioration management unit 50 calculates the deterioration degree corresponding to the elapsed time as the storage deterioration with reference to this map.

The deterioration degree estimation unit 40 stores the correspondence relationship between the resistance increase rate, the storage deterioration degree, and the capacity retention rate as a map. According to the correspondence relationship represented by the map, the capacity retention rate decreases as the resistance increase rate increases. In addition, when the resistance increase rate is set to a constant value, the capacity retention rate decreases as the storage deterioration degree increases. The deterioration degree estimation unit 40 refers to a map, and estimates the capacity retention rate corresponding to the resistance increase rate and the storage deterioration degree as the current capacity retention rate of the battery 1. When the resistance increase rate is the same value, the deterioration degree estimation unit 40 estimates the current deterioration degree of the battery 1 such that the deterioration degree of the battery 1 increases as the ratio of the storage deterioration degree increases. As a result, the deterioration degree estimation unit 40 corrects the resistance deterioration degree calculated based on the internal resistance of the battery 1 such that the resistance deterioration degree increases as the storage deterioration increases, and estimates the corrected resistance deterioration degree as the current deterioration.

As described above, in the present embodiment, the internal resistance of the battery 1 is calculated, the storage deterioration of the battery 1 is managed, and the deterioration degree of the battery 1 is estimated based on the increase rate of the internal resistance of the battery 1. Then, the estimated deterioration degree of the battery 1 is increased as the storage deterioration is increased. It is thereby possible to increase the estimation accuracy of the deterioration degree of the battery 1.

Since the storage deterioration management unit 50 measures time using a timer mounted in a vehicle, the time from when the electrode comes in contact with the electrolyte to when timing with the vehicle timer is started in the battery manufacturing process cannot be timed. Therefore, the time from when the electrode comes in contact with the electrolyte to when timing with the vehicle timer is started can be managed to be a fixed time, and the fixed time can be added to the time measured by the timer. In addition, since the time from when the electrode comes in contact with the electrolyte to when timing with the vehicle timer is started is extremely short compared to the life of the battery 1, the time can simply be ignored.

In addition, as a modified example of the present embodiment, the storage deterioration management unit 50 can correct the storage deterioration based on the temperature of the battery 1. As a characteristic of the battery 1, storage deterioration has temperature dependence, as illustrated in FIG. 6.

Figure 6:
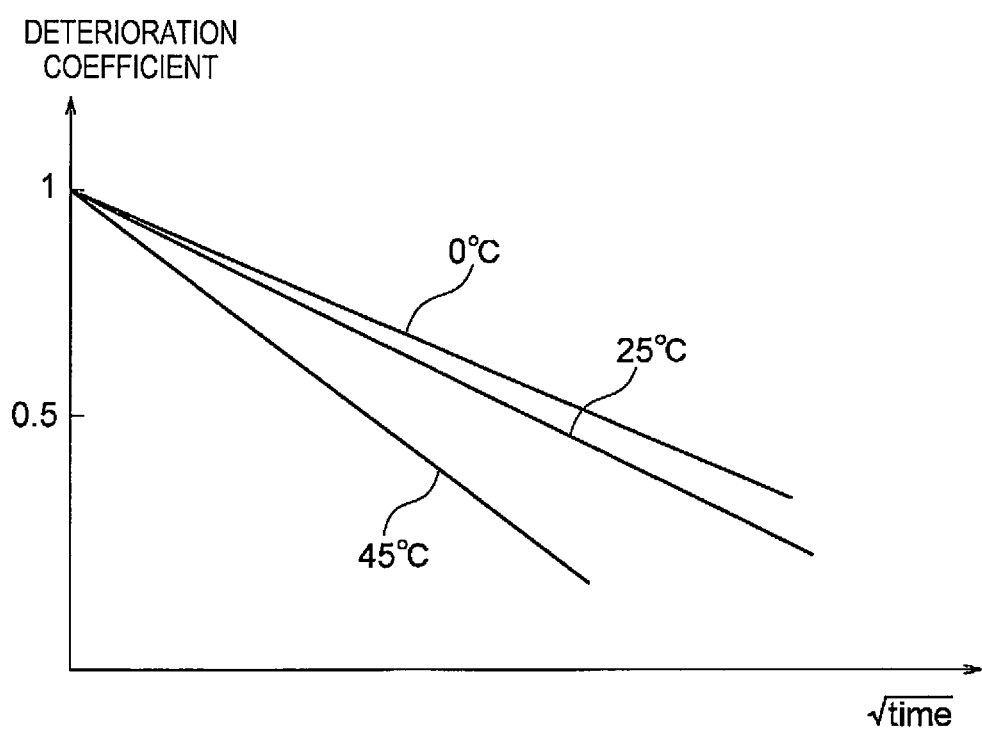
FIG. 6 is a graph of the time characteristics illustrating the relationship between the battery temperature and the deterioration coefficient.

FIG. 6 is a graph illustrating the time characteristics of the deterioration coefficient. In FIG. 6, the horizontal axis represents the square root of time, and the vertical axis represents the deterioration coefficient. The deterioration coefficient is a coefficient that is multiplied by the capacity retention rate. The capacity retention rate becomes smaller and the deterioration degree increases as the deterioration coefficient becomes smaller. In addition, if the time is the same, the deterioration coefficient becomes smaller as the temperature increases. The storage deterioration management unit 50 stores in advance a correction coefficient that represents the relationship between storage deterioration and temperature. This correction coefficient corresponds to the deterioration coefficient. However, while the deterioration coefficient shown by the characteristic of FIG. 6 is a coefficient that is multiplied by the capacity retention rate, the correction coefficient is set to a coefficient that can calculate the deterioration degree while maintaining the relationship shown by the characteristic of FIG. 6.

The storage deterioration management unit 50 uses temperature information that is output by the temperature sensor of the battery 1 and stores, in a memory, the frequency of the temperature up to this time at a set period unit, based on the time information of the timer. The storage deterioration management unit 50 corrects the storage deterioration degree using the temperature information stored in the memory. Specifically, for example, the storage deterioration management unit 50 obtains the time that the battery 1 is exposed to the temperature, using temperature occurrence frequency information that is stored. Next, the storage deterioration management unit 50 calculates the storage deterioration degree with respect to the obtained time, and multiplies the storage deterioration degree by the correction coefficient. The storage deterioration management unit 50 carries out the same calculation for each temperature interval, and calculates the storage deterioration degree for each interval. Then, the storage deterioration management unit 50 calculates the final storage deterioration degree by calculating the storage deterioration degree for each interval. The storage deterioration management unit 50 thereby corrects the storage deterioration based on the temperature of the battery 1. In the present embodiment, it is possible to increase the calculation accuracy of the storage deterioration degree by applying temperature sensitivity to the storage deterioration of the battery 1.

In addition, as a modified example of the present embodiment, the storage deterioration management unit 50 can correct the storage deterioration based on the SOC of the battery 1. As a characteristic of the battery 1, storage deterioration is dependent on the SOC, as illustrated in FIG. 7.

Figure 7:
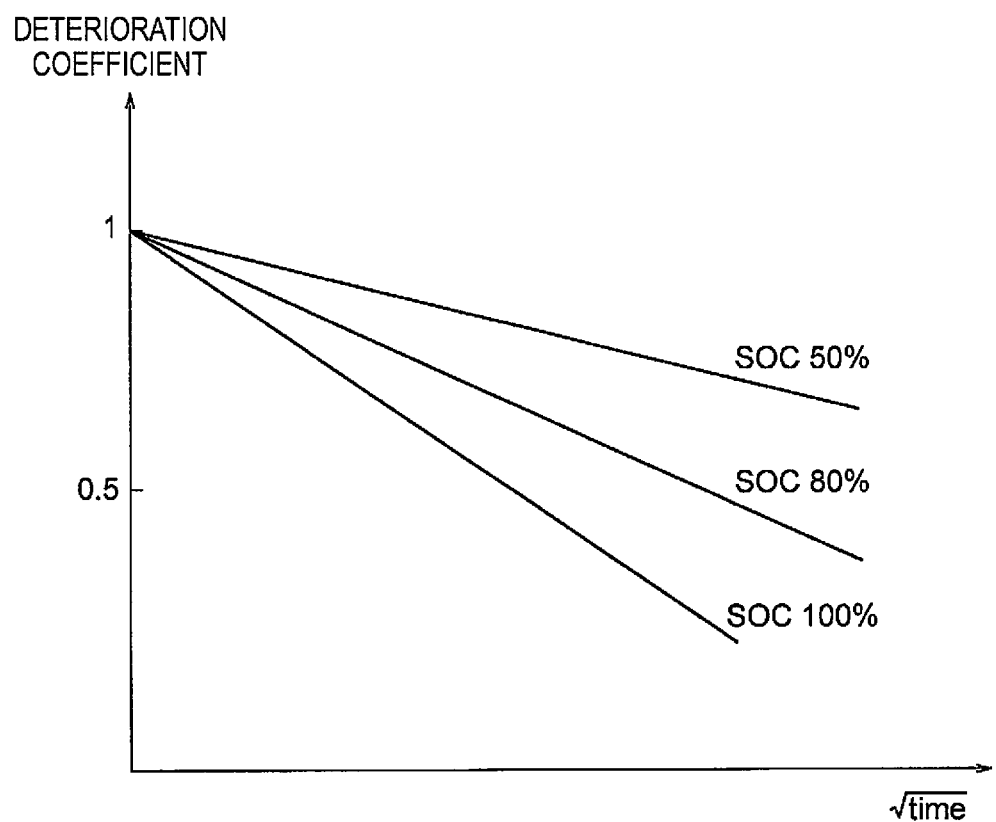
FIG. 7 is a graph of the time characteristics illustrating the relationship between the SOC and the deterioration coefficient.

FIG. 7 is a graph illustrating the time characteristics of the deterioration coefficient. In FIG. 7, the horizontal axis represents the square root of time, and the vertical axis represents the deterioration coefficient. The deterioration coefficient is the same as the deterioration coefficient shown in FIG. 6. The capacity retention rate becomes smaller and the deterioration degree increases as the deterioration coefficient becomes smaller. In addition, if the time is the same, the deterioration coefficient becomes smaller as the SOC increases.

The storage deterioration management unit 50 stores in advance a correction coefficient that represents the relationship between storage deterioration and SOC. The storage deterioration management unit 50 uses the SOC, and stores, in a memory, the frequency of the SOC up to this time at a set period unit, based on the time information of the timer. The storage deterioration management unit 50 corrects the storage deterioration degree using the SOC information stored in the memory. Specifically, for example, the storage deterioration management unit 50 obtains the time that the battery 1 maintains the SOC, using the SOC occurrence frequency information that is stored. Next, the storage deterioration management unit 50 calculates the storage deterioration degree with respect to the obtained time, and multiplies the storage deterioration degree by the correction coefficient. The storage deterioration management unit 50 carries out the same calculation for each SOC interval, and calculates the storage deterioration degree for each interval. Then, the storage deterioration management unit 50 calculates the final storage deterioration degree by calculating the storage deterioration degree for each interval. The storage deterioration management unit 50 thereby corrects the storage deterioration based on the SOC of the battery 1. In the present embodiment, it is possible to increase the calculation accuracy of the storage deterioration degree by applying the SOC sensitivity to the storage deterioration of the battery 1.

The storage deterioration management unit 50 can correct the storage deterioration degree based on the temperature and the SOC of the battery 1 by combining the two modified examples described above.

The storage deterioration management unit 50 described above corresponds to the deterioration management unit of the present invention.

The invention claimed is:
1. A capacity retention rate estimation device comprising:
a controller configured to:
detect an internal resistance of a battery;
determine a rate of increase of the internal resistance of the battery, the rate of increase of the internal resistance being a rate at which the internal resistance of the battery increases with respect to an initially detected internal resistance of the battery;
calculate an actual current integration value by integrating a detected discharge current of the battery during an elapsed time from a start of battery use to a present time and calculate a reference current integration value based on the elapsed time;

calculate an integrated current ratio, which is a ratio of the actual current integration value to the reference current integrated value; and estimate a capacity retention rate of the battery as an estimated capacity retention rate based on a map that shows a correspondence relationship between the determined rate of increase of the internal resistance and the integrated current ratio, the map showing that: the capacity retention rate decreases as the rate of increase of the internal resistance increases, and the capacity retention rate decreases as the integrated current ratio decreases.

2. The capacity retention rate estimation device according to claim 1, wherein the controller is configured to correct the determined rate of increase of the internal resistance based on the actual current integration value.

3. The capacity retention rate estimation device according to claim 1, wherein the controller is configured to calculate the capacity retention rate of the battery corresponding to the determined rate of increase of the internal resistance as a reference capacity retention rate, correct the reference capacity retention rate based on the actual current integration value and estimate a corrected reference capacity retention rate as the estimated capacity retention rate.

4. The capacity retention rate estimation device according to claim 1, wherein the controller is configured to correct the estimated capacity retention rate based on a temperature of the battery.

5. The capacity retention rate estimation device according to claim 1, wherein the controller is configured to correct the estimated capacity retention rate based on a charging state of the battery.

6. A capacity retention rate estimation method comprising:

detecting an internal resistance of a battery;

determining a rate of increase of the internal resistance of the battery, the rate of increase of the internal resistance being a rate at which the internal resistance of the battery increases with respect to an initially detected internal resistance of the battery;

calculating an actual current integration value by integrating a detected discharge current of the battery during an elapsed time from a start of battery use to a present time and calculate a reference current integration value based on the elapsed time;

calculating an integrated current ratio, which is a ratio of the actual current integration value to the reference current integrated value; and estimating a capacity retention rate of the battery as an estimated capacity retention rate based on a map that shows a correspondence relationship between the determined rate of increase of the internal resistance and the integrated current ratio, the map showing that: the capacity retention rate decreases as the rate of increase of the internal resistance increases, and the capacity retention rate decreases as the integrated current ratio decreases.

* * * * *